(12) United States Patent
Yamamoto et al.

(10) Patent No.: US 7,598,120 B2
(45) Date of Patent: Oct. 6, 2009

(54) METHOD FOR HOLDING SEMICONDUCTOR WAFER

(75) Inventors: Masayuki Yamamoto, Ibaraki (JP); Kazuo Morimoto, Kameyama (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 12/114,544

(22) Filed: May 2, 2008

(65) Prior Publication Data
US 2008/0293221 A1 Nov. 27, 2008

(30) Foreign Application Priority Data
May 25, 2007 (JP) ............................. 2007-139089

(51) Int. Cl.
*H01L 21/44* (2006.01)
*H01L 21/48* (2006.01)
*H01L 21/50* (2006.01)

(52) U.S. Cl. ........................ 438/106; 438/113; 438/460; 438/463; 257/E21.237; 257/E21.329; 257/E21.499

(58) Field of Classification Search ................. 438/106, 438/113, 111, 140, 460, 463
See application file for complete search history.

(56) References Cited

U.S. PATENT DOCUMENTS 7,122,447 B2 * 10/2006 Abe ........................... 438/460

2004/0097054 A1 * 5/2004 Abe ........................... 438/460
2007/0015342 A1 * 1/2007 Abe ........................... 438/458

FOREIGN PATENT DOCUMENTS

JP 2007-103582 A 4/2007

* cited by examiner

*Primary Examiner*—David Nhu
(74) *Attorney, Agent, or Firm*—Cheng Law Group, PLLC

(57) ABSTRACT

Provided is a method comprising: back grinding a back side or a semiconductor wafer W having a protective tape applied on the surface thereof leaving annularly an outer peripheral part un-ground; separating the protective tape from a surface of the semiconductor wafer W having an annular projected part formed in the outer peripheral part of the back side; applying a holding tape over the surface of the semiconductor wafer W from which the protective tape having been separated and a surface of a ring frame f; removing and separating the outer peripheral part in the semiconductor wafer applied and held on the holding tape, by annularly cutting; applying a dicing tape over the back side of the semiconductor wafer having been made flat and the back side of the ring frame; and separating the holding tape from the ring frame and the semiconductor wafer.

10 Claims, 7 Drawing Sheets

METHOD FOR HOLDING SEMICONDUCTOR WAFER

BACKGROUND OF THE INVENTION (1) Field of the Invention

The present invention relates a technique for applying and holding a semiconductor wafer onto a ring frame via a adhesive tape, as a preceding process of a dicing treatment of the semiconductor wafer.

(2) Description of the Related Art

Following processes are performed in steps for cutting semiconductor chips out from semiconductor wafers:

formation of a mount frame by application and holding of a semiconductor wafer to a pressure sensitive adhesive tape (dicing tape) that has been applied on a ring frame;

transportation of the mount frame into a dicing process;

dicing treatment to the semiconductor wafer that has been applied and supported; and dividing the chip.

The back side of the semiconductor wafer to be held on the ring frame is ground to be thinner, before the holding. An annular projected part is formed excluding the periphery part of the semiconductor wafer in order to avoid generation of warpage caused by accumulation of a working stress in the semiconductor wafer upon grinding, and to avoid breakage of the semiconductor wafer during handling accompanied by this thickness reduction process. This annular projected part keeps rigidity of the semiconductor wafer (refer to Japanese Unexamined Patent Publication No. 2007-103582 official report).

In recent years, thickness reduction of wafers are promoted from necessity of miniaturization of electronic equipments, and high density mounting etc. And therefore, semiconductor wafers having a smaller thickness of the order of approximately 10 micrometers tend to give cracking and chipping by warpage thereof. Furthermore, the semiconductor wafers have a higher risk of breakage in various kinds of process steps and handling. Therefore, the steps of application and holding of such a semiconductor wafers having a smaller thickness to the ring frame through a pressure sensitive adhesive tape for support may have problems of much higher risk of breakage.

Especially, the annular projected part left at the time of grinding of the semiconductor wafer must be removed before the dicing treatment. Accordingly, there may arise a possible problem of damaging of the semiconductor wafer caused by action, to the semiconductor wafers having a smaller thickness, of a working stress in removal of the annular projected part or by a stress accumulated in the wafer in back grinding processing immediately after removal of the annular projected part.

SUMMARY OF THE INVENTION

A main object of the present invention is to provide a method for holding a semiconductor wafer, the method allowing application and holding of the semiconductor wafer to a ring frame through a adhesive tape for supporting in order to suppress breakage caused by thickness reduction of the semiconductor wafer.

In order to achieve the object, the present invention employs following constitution. That is, the present invention provides a method for holding a semiconductor wafer by applying the semiconductor wafer on a ring frame through a adhesive tape, the method comprising:

applying a protective tape on a surface of the semiconductor wafer having a pattern formation process performed thereto, and subsequently cutting the protective tape along with a contour of the wafer;

back grinding a back side of the semiconductor wafer having the protective tape applied thereto, and simultaneously leaving annularly an outer peripheral part un-ground;

separating the protective tape from a surface of the semiconductor wafer having an annular projected part formed by the back grinding in the outer peripheral part of the back side;

applying a holding tape over the surface of the semiconductor wafer from which the protective tape having been separated and a surface of the ring frame having the semiconductor wafer disposed in the center thereof;

removing the annular projected part of the semiconductor wafer having been applied and held on the holding tape;

applying the adhesive tape over the back side of the semiconductor wafer having been made flat by removal of the annular projected part and a back side of the ring frame; and separating the holding tape having been applied over the surface of the ring frame and the surface of the semiconductor wafer.

The method for holding the semiconductor wafer of the present invention allows handling of a semiconductor wafer having a thickness for maintaining a predetermined rigidity before and during the pattern formation process. Furthermore, the method allows handling of the semiconductor wafer in a condition having a high rigidity with reinforcement by an annular projected part in a peripheral part thereof, in a back grinding process accompanied by a possible large stress working thereto.

The annular projected part for reinforcement that has been formed on the semiconductor wafer will be removed during each subsequent process. That is, the possibility of holding of only a thinner main body of the semiconductor wafer by the ring frame through the adhesive tape will allow handling accompanied by maintained rigidity so that action of a working stress to the semiconductor wafer may be avoided. Furthermore, more accurate and easier operation in the dicing treatment of the main body of the thin semiconductor wafer and the chip dividing process will thus be attained.

In addition, in the removal process of the annular projected part, for example, the outer peripheral part of the back grinding area of the semiconductor wafer applied and held on the holding tape may cut annularly, and then the part concerned may be separated and removed from the adhesive tape.

Alternatively, in another method, the outer peripheral part of the back grinding area of the semiconductor wafer applied and held on the holding tape may be ground and removed to a level of the thickness after back grinding.

Furthermore, an ultraviolet curing type pressure sensitive adhesive tape is used as the holding tape, and the holding tape applied on the annular projected part is preferably irradiated by ultraviolet rays before the cutting and removal of the annular projected part in the process of cutting and removal of the annular projected part.

Since this method cures the adhesive layer of the adhesive tape and lowers the adhesive strength, easier separation and removal of the cutting part will be attained. The method suppresses the deformation of the adhesive tape upon separation of the cutting part, and as a result it may suppress the action of an unnecessary stress to the semiconductor wafer held with the adhesive tape, leading to avoidance of breakage.

Here, in the above described method, a suction table that has a projected part for sucking and has a diameter smaller than the inside diameter of the annular projected part sucks and holds a flat depressed part inside the annular projected part of the semiconductor wafer having the annular projected part formed therein for subsequent application of the above described various tapes.

More preferably, a flat surface of the annular projected part on the side of an un-applied surface is held in application of the various tapes.

This method enables holding of the semiconductor wafer or the ring frame in a flush condition, and thereby the method may provide a uniform pressing of a laminating roller, leading to the reliable application of the various tapes.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

The procedure of the method for holding the semiconductor wafer by the present invention will be described with reference to drawings.

Figure 1:
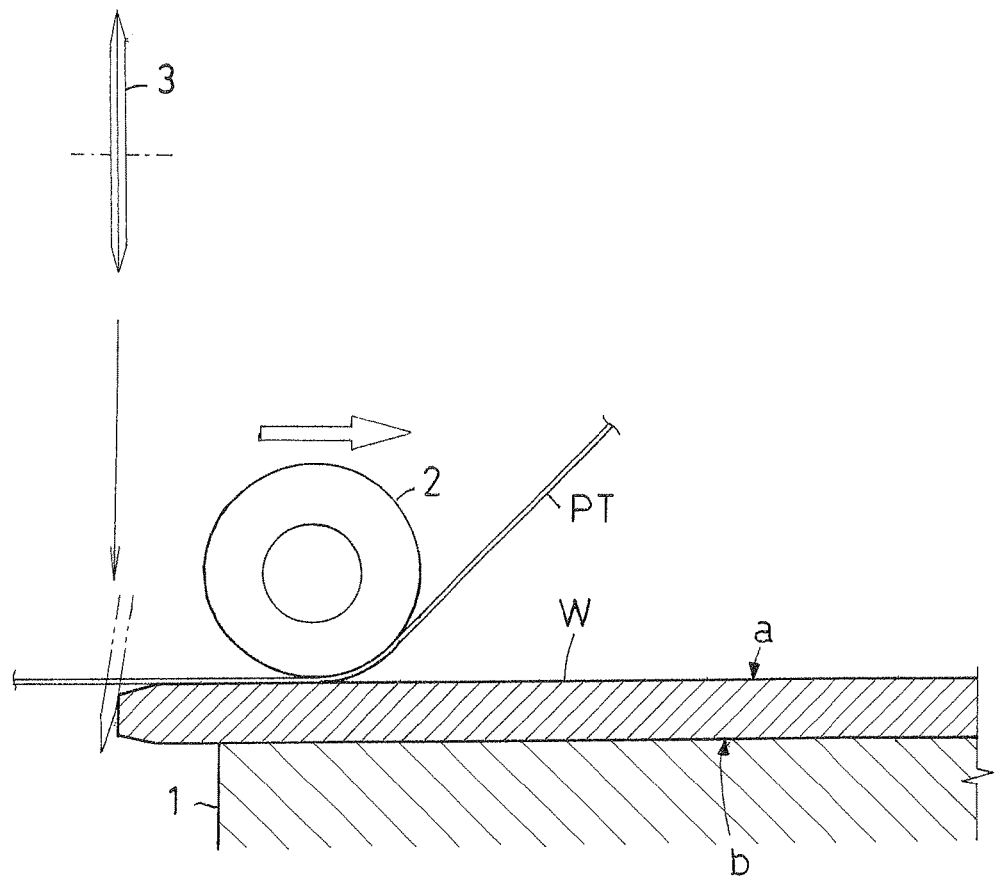
FIG. 1 illustrates a vertical section of the principal part showing a protective tape application process.

As illustrated in FIG. 1, a semiconductor wafer W (hereinafter referred to as only "wafer W") that is a target of process here has a thickness of hundreds of micrometers on the whole surface thereof, and the process of formation of circuit patterns is performed to the surface a thereof.

[Protective Tape Application Process]

As illustrated in FIG. 1, the wafer W after the pattern formation process is mounted on the chuck table 1 with the surface facing upward, and then suction-held, and then a protective tape PT to be pressed by a rolling laminating roller 2 is applied all over the surface a of the wafer W.

When the tape application to the wafer W is completed, a disk type cutter 3 that has been standing ready above descends, and is stuck into the protective tape PT. This cutter 3 moves with rotation while sliding on the outer circumferential edge of the wafer. Thus, the protective tape PT is cut along with the contour of the wafer by this operation.

[Back Grinding Process]

Figure 2:
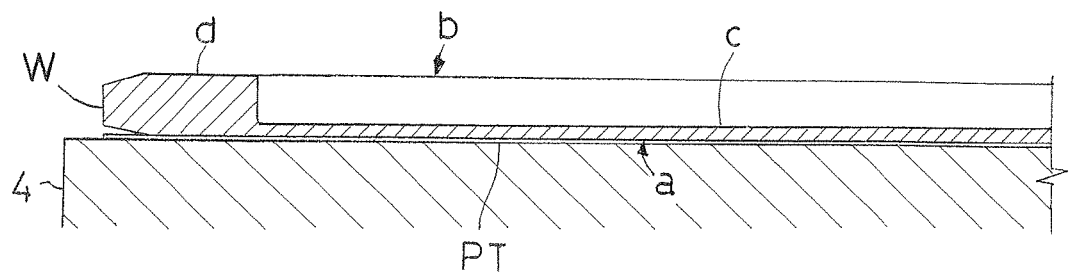
FIG. 2 illustrates a vertical section of the principal part after a back grinding process.

As illustrated in FIG. 2, the wafer W having the protective tape PT applied on the surface a thereof is transported to a back grinding apparatus. At this time, the wafer W in a position with a back side b facing upward is mounted and held on a chuck table 4. In this condition, back grinding of the wafer W is carried out by a rotating grinder (not illustrated) from the upper side.

Figure 13:
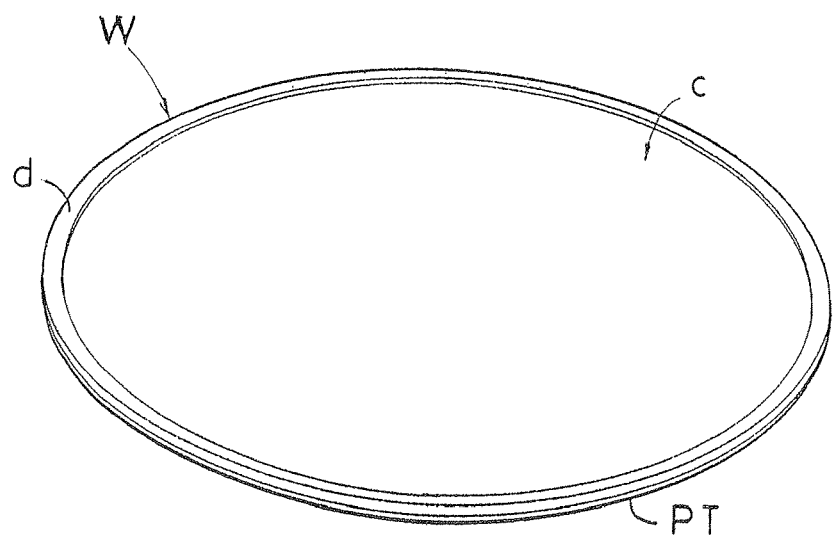
FIG. 13 illustrates a perspective view of the semiconductor wafer after the back grinding process.

In this case, the wafer W is ground, leaving the peripheral part about 2 mm in a radial direction. Accordingly, a flat depressed part c is formed in the back side b facing upward of the wafer W, and thus the wafer W is processed into a shape having an annular projected part d left along with the periphery (refer to FIG. 13). The grinding process is then performed so that the thickness of the wafer of the flat depressed part c may give tens of micrometers, and then the surface a that makes an opposed face in an area of this flat depressed part c will include whole circuit patterns. The annular projected part d formed in the periphery back side serves as an annular rib for improving the rigidity of the wafer W, accordingly leading to suppression of bending and deformation of the wafer W in handling or in the subsequent process.

[Protective Tape Separating Process]

Figure 3:
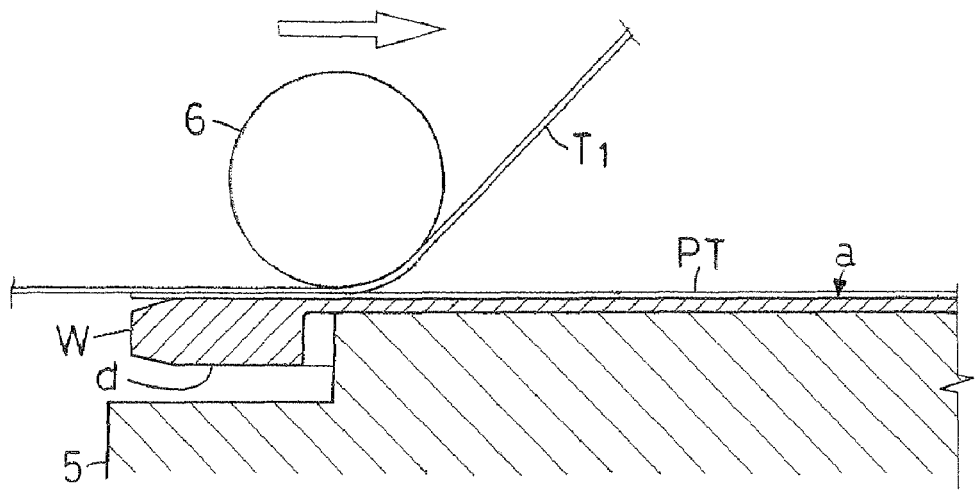
FIG. 3 illustrates a vertical section of the principal part illustrating the first half of the protective tape peeling process.

As illustrated in FIG. 3, the wafer W that has passed through the back grinding process is mounted and held on the chuck table 5 upside down, after receiving a stress-removing process, such as a vacuum evaporation of metals by sputtering. At this point, the flat projected part of the chuck table 5 that has a diameter smaller than the inside diameter of the annular projected part d is inserted in the annular projected part of the wafer W, and then the back side b is suction-held. Subsequently, a laminating roller 6 is rolled, while being pressed, and then a release tape T1 having a stronger adhesiveness is applied on the protective tape PT.

Figure 4:
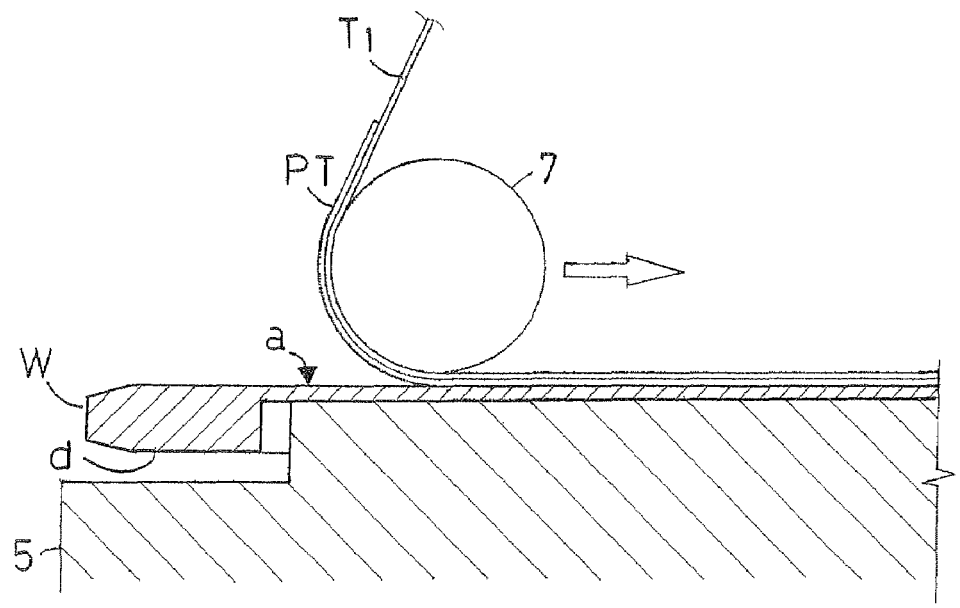
FIG. 4 illustrates a vertical section of the principal part illustrating the latter half of the protective tape separating process.

As illustrated in FIG. 4, after application of the release tape T1 is completed, the release tape T1 is taken up and collected by the rolling motion of the separating roller 7. Here, the protective tape PT laminated to the release tape T1 is integrally taken up with the release tape T1, and separates from the surface a of the wafer W.

[Holding Tape Application Process]

Figure 5:
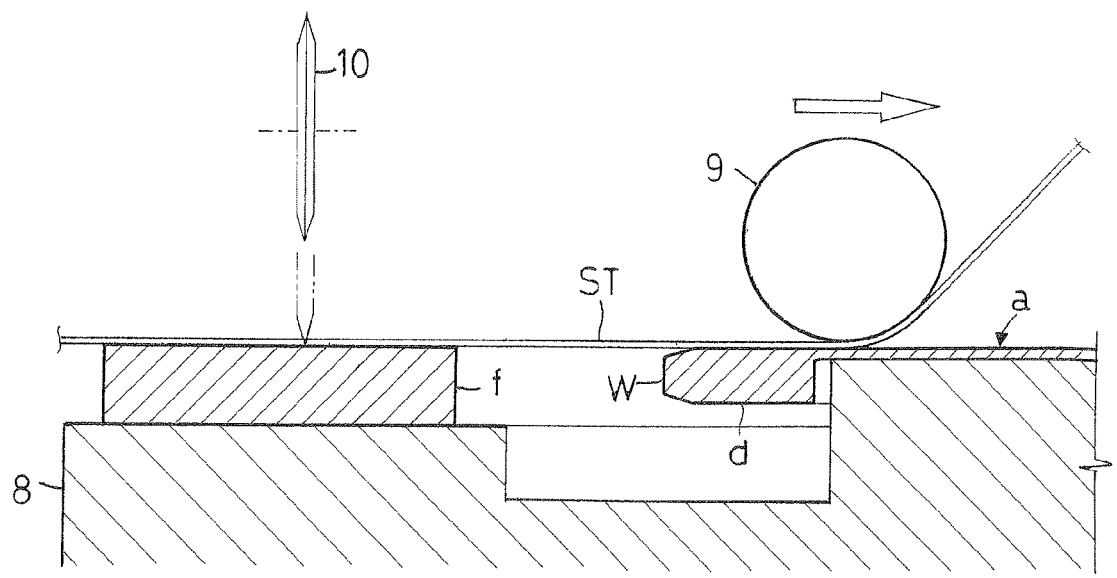
FIG. 5 illustrates a vertical section of the principal part illustrating a holding tape application process.

As illustrated in FIG. 5, the wafer W from which the protective tape PT has been separated is transported to a mounting device, and then is mounted and held in the central part of a chuck table 8 with an attitude facing the surface a upward.

A ring frame f is supplied to be loaded to this chuck table 8, for enclosing the wafer W. The wafer W and the ring frame f are set so that those two upper surfaces may be flush with each other. The laminating roller 9 rolls on them while pressing them in this condition. Thereby, the ultraviolet curing type holding tape ST is applied over the upper surface of the ring frame f and the surface a of the wafer W.

When application is completed, a disk type cutter 10 that has been standing ready above the ring frame descends, and is pressed on the holding tape ST, and subsequently the cutter 10 rotates around the circumference of the center of the ring frame f. Thereby, the cutter blade 10 circularly cuts the holding tape ST, with a little larger diameter than the inside diameter of the ring frame f. As a result, the wafer W will be in the condition of having applied on the ring frame f and having held through the holding tape ST.

[Annular Projected Part Removal Process]

Figure 6:
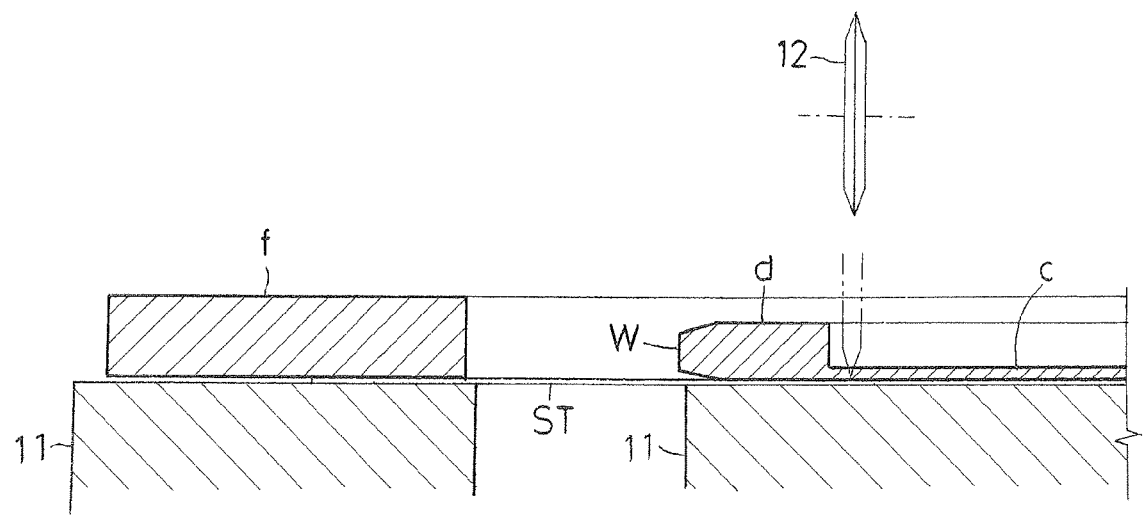
FIG. 6 illustrates a vertical section of the principal part illustrating the first half of the removal process of the annular projected part.

As illustrated in FIG. 6, the ring frame f holding the wafer W is transported out, and is mounted and held on the chuck table 11 upside down. A disk type rotating grinder 12 is standing ready in the table upper part. When the position adjustment and holding of the ring frame f and the wafer W are confirmed, the rotating grinder 12 will descend and will contact the wafer W. This rotating grinder 12 moves, while rotating, along with the vicinity of the peripheral edge of the flat depressed part c, that is, the boundary of the inner circumference of the annular projected part d. Thereby, the flat depressed part c of the wafer W is circularly cut, leaving the holding tape ST.

Figure 7:
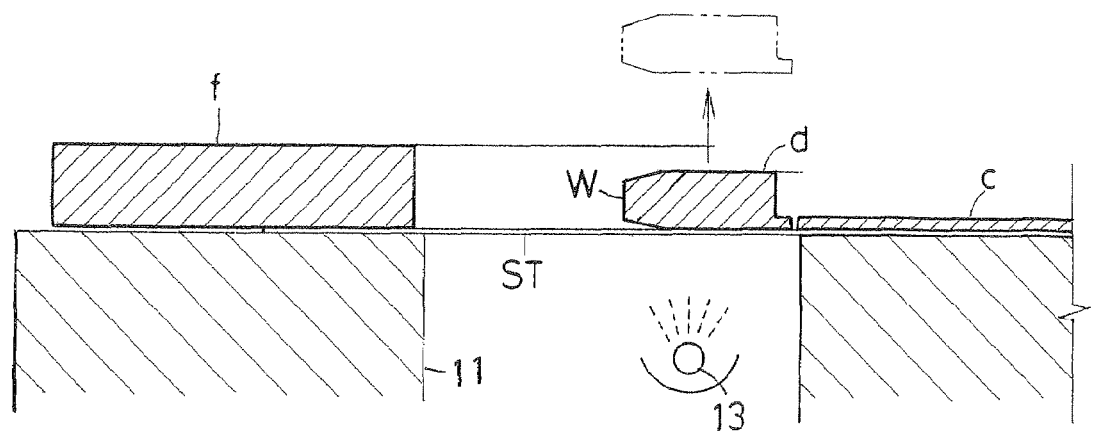
FIG. 7 illustrates a vertical section of the principal part illustrating the latter half of the removal process of the annular projected part.

Next, as illustrated in FIG. 7, as the rotating grinder 12 ascends and retracts, an ultraviolet ray lamp 13 mounted in the chuck table is turned on, and the holding tape ST disposed closer to the periphery side than the region that has been cut by the rotating grinder 12 is irradiated by ultraviolet rays from downward. Thereby, the adhesive power of the holding tape ST is reduced, and the adhesive strength will reduce between the annular projected part d and the holding tape in a region disposed closer to the outside region that has been cut. Subsequently, the annular projected part d that has been cut off is removed by a suitable handling device such as a robot hand provided with an adsorption nozzle. Thus, the thin and flat main body of the wafer W is applied and held in the center of the ring frame f.

[Dicing Tape Application Process]

Figure 8:
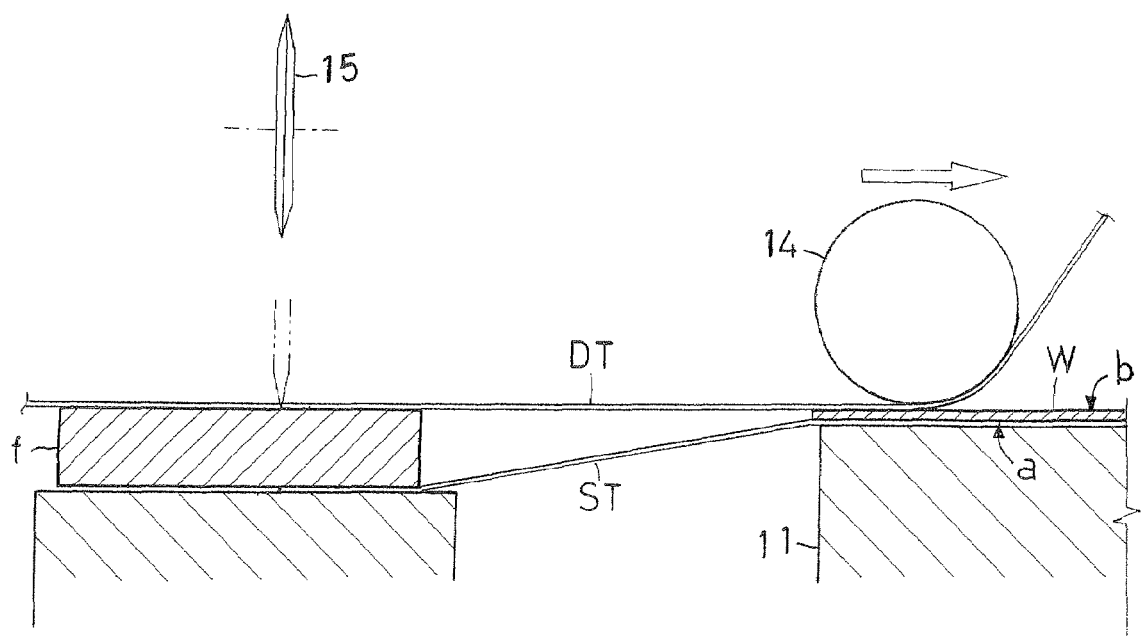
FIG. 8 illustrates a vertical section of the principal part illustrating the dicing tape application process.

As illustrated in FIG. 8, the ring frame f for holding the thin flat main body of the wafer W are turned upside down, and the wafer W is mounted and held on the chuck table 11 with an attitude facing the ring frames f and the back side b of the wafer W upward. When holding of the ring frame f and the wafer W is completed, a dicing tape DT is supplied on them. A laminating roller 14 rolls, while pressing, on the non-pressure sensitive adhesive face of this dicing tape DT. Thus, the dicing tape DT is applied over the back side of the ring frame f and the back side b of the wafer W. The dicing tape DT here is equivalent to the pressure sensitive adhesive tape of the present invention.

Next, a disk type cutter 15 that has been standing ready above the ring frame f descends, and is pressed against the dicing tape DT. Subsequently, the cutter 15 rotates around the circumference of the center of the ring frame f, and cuts the dicing tape DT circular with a little larger diameter than the inside diameter of the ring frame f. In this way, the thin and flat wafer W is held through the holding tape ST and the dicing tape DT on the ring frame f, forming an intermediate mounted body.

[Holding Tape Separating Process]

Figure 9:
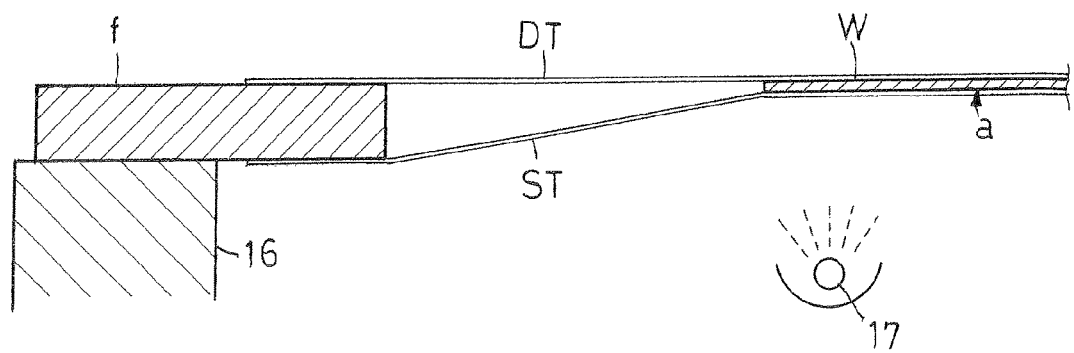
FIG. 9 illustrates a vertical section of the principal part illustrating the first half of the holding tape separating process.

As illustrated in FIG. 9, the intermediate mounted body obtained by holding the wafer W to the ring frame f through the holding tape ST and the dicing tape DT is taken out, and then is mounted on a ring shape table 16 for catching and supporting only the peripheral part of the ring frame f. Then, an ultraviolet ray lamp 17 built in the center of the table is turned on, and the whole surface of the holding tape ST is irradiated by ultraviolet rays, resulting in reduction of an adhesive strength of the holding tape ST.

Figure 10:
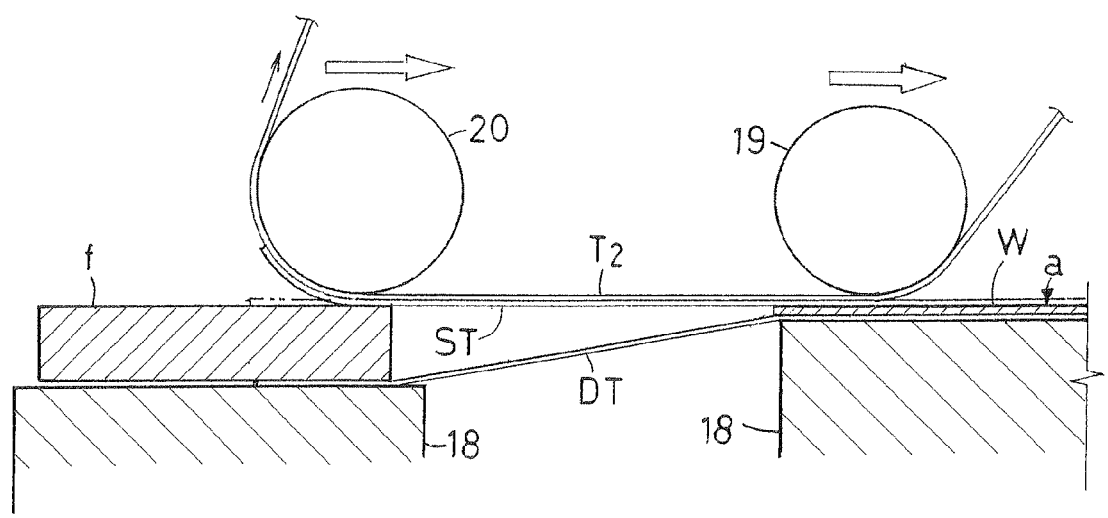
FIG. 10 illustrates a vertical section of the principal part illustrating the latter half of the holding tape separating process.

Next, as illustrated in FIG. 10, the intermediate mounted body after UV irradiation is taken out, then turned upside down, is mounted and held on a chuck table 18. The wafer W and the ring frame f are set so that those two upper surfaces may be flush with each other. A release tape T2 is supplied on them, and a laminating roller 19, while pressing, rolls on the non-pressure sensitive adhesive face of this release tape T2, thereby applying the release tape T2 on the holding tape ST.

Figure 11:
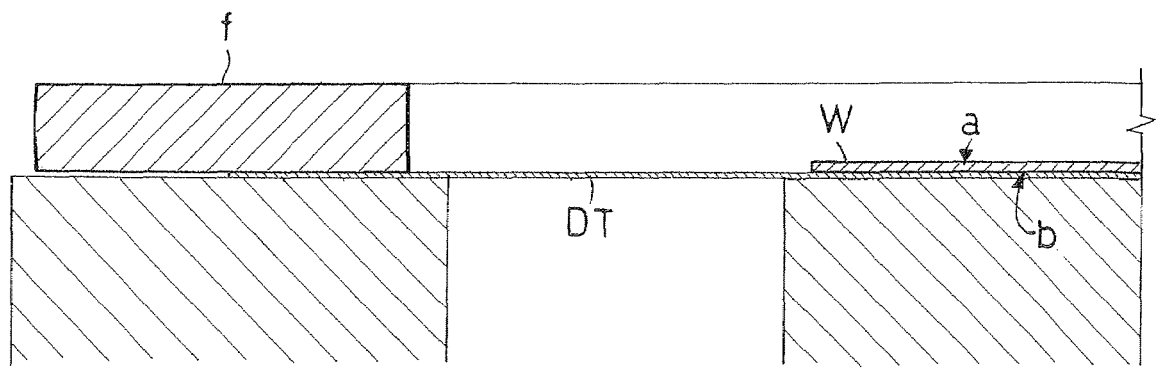
FIG. 11 illustrates a vertical section of the principal part after the holding tape separating process.

Then, the release tape T2 is rolled round and collected by rolling and movement of the separating roller 20. The holding tape ST applied to the release tape T2 is integrally taken up with the release tape T2, and is separated from the surface a of the ring frame f and the wafer W. That is, as illustrated in FIG. 11, the wafer W will be in the condition of being applied and held from the back side b on the ring frame f only through the dicing tape DT.

Figure 12:
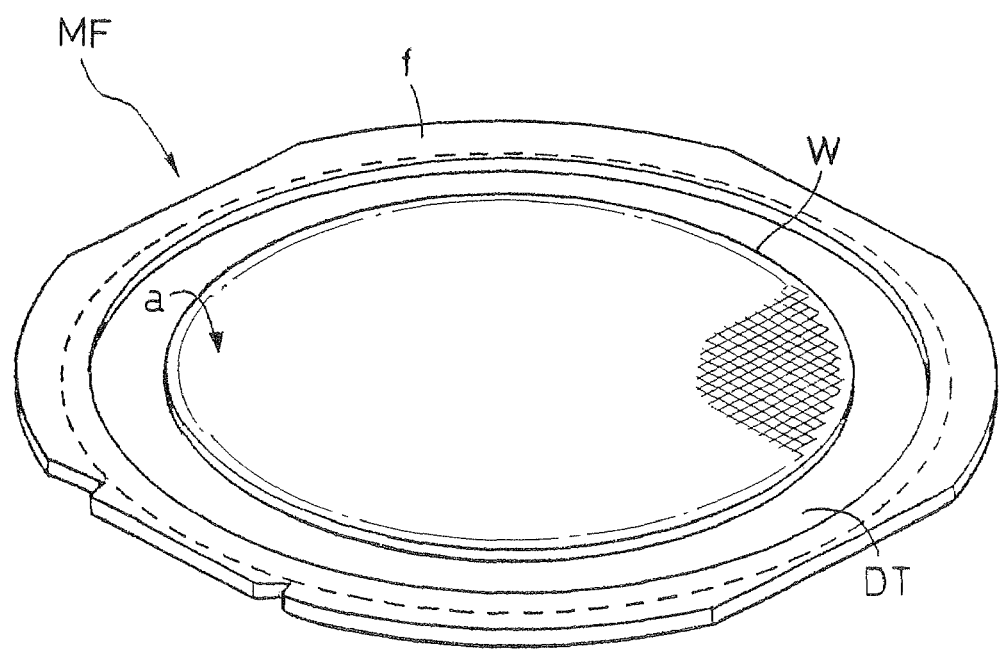
FIG. 12 illustrates a perspective view of the completed mount frame.

Passing through the above described process, as illustrated in FIG. 12, the wafer W is applied and held on the ring frame f through the dicing tape DT, and a mount frame MF having the exposed surface a with a formed pattern thereon may be obtained. Accordingly, the mount frame MF may be immediately transported to the dicing apparatus, and may be subjected to the dicing treatment and the chip dividing process.

That is, since the wafer W is held on the holding tape on the ring frame f when the annular projected part d is removed, the wafer W will not be handled only by the flat main body after removal of the annular projected part d. Accordingly, an unnecessary working stress will work only on the flat main body of the wafer W having rigidity in the background processing and the annular projected part removal process, and therefore the breakage of the flat depressed part c having circuit patterns thereon may be avoided.

The present invention is not limited to the above-described embodiments, but may be modified and may also be carried out.

Figure 14:
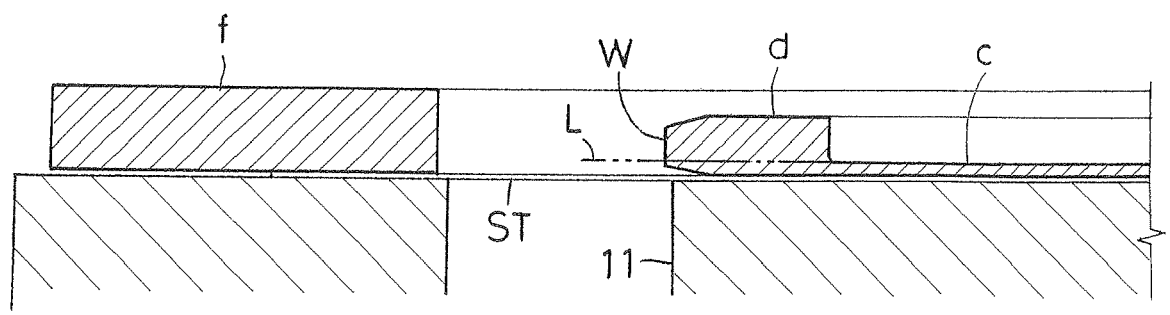
FIG. 14 illustrates a vertical section of the principal part illustrating another embodiment of the removal process of the annular projected part.

In the annular projected part removal process in the above-described embodiment, as illustrated in FIG. 14, the annular projected part d is formed lower by grinding of the outer peripheral part of the back grinding area of the wafer W that has been applied on the holding tape ST and held to a level of the thickness L after back grinding. The flat processing of the wafer W may also be performed in this configuration.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for holding a semiconductor wafer by applying the semiconductor wafer on a ring frame through a adhesive tape, the method comprising:

applying a protective tape on a surface of the semiconductor wafer having a pattern formation process performed thereto and subsequently cutting the protective tape along with a contour of the semiconductor wafer;

back grinding a back side of the semiconductor wafer having the protective tape applied thereto, simultaneously leaving annularly an outer peripheral part unground;

separating the protective tape from a surface of the semiconductor wafer having an annular projected part formed by the back grinding in the outer peripheral part of the back side;

applying a holding tape over the surface of the semiconductor wafer from which the protective tape having been separated and a surface of the ring frame having the semiconductor wafer disposed in a center thereof;

removing the annular projected part of the semiconductor wafer having been applied and held on the holding tape;

applying an adhesive tape over the back side of the semiconductor wafer having been made flat by removal of the annular projected part and a back side of the ring frame; and separating the holding tape having been applied over the surface of the ring frame and the surface of the semiconductor wafer.

2. The method for holding the semiconductor wafer according to claim 1, wherein an outer peripheral part of a back grinding area of the semiconductor wafer that has been applied and held on the holding tape is cut annularly, and the outer peripheral part is separated and removed from the adhesive tape, in the removing of the annular projected part.

3. The method for holding the semiconductor wafer according to claim 2, wherein the holding tape is an ultraviolet curing type pressure sensitive adhesive tape, and an applied surface of the holding tape of the annular projected part is irradiated by ultraviolet rays before cutting and removal of the annular projected part.

4. The method for holding the semiconductor wafer according to claim 1, wherein the outer peripheral part of the back grinding area of the semiconductor wafer that has been applied and held on the holding tape is ground and removed to a level of a thickness after back grinding, in the removing of the annular projected part.

5. The method for holding the semiconductor wafer according to claim 1, wherein a suction table having a projected part for sucking with a diameter smaller than an inside diameter of the annular projected part of the semiconductor wafer sucks and holds a flat depressed part inside the annular projected part, then in this condition, while a non-adhesive face of the release tape that is wound around a laminating roller and supplied is pressed with the laminating roller, the laminating roller is rolled on the protective tape on the surface of the wafer to apply the release tape, and simultaneously the release tape and the protective tape are separated integrally, in the separating of the protective tape.

6. The method for holding the semiconductor wafer according to claim 5, wherein a flat surface of the annular projected part of an un-applied surface is held upon application of the release tape, in the separating of the protective tape.

7. The method for holding the semiconductor wafer according to claim 1, wherein a suction table having a projected part for sucking with a diameter smaller than an inside diameter of the annular projected part of the semiconductor wafer sucks and holds a flat depressed part inside the annular projected part, and in this condition, while a non-adhesive face of a holding tape that is wound around a laminating roller is supplied is pressed with the laminating roller, the laminating roller is rolled on the holding tape on the surface of the wafer to apply the holding tape.

8. The method for holding the semiconductor wafer according to claim 7, wherein a flat surface of the annular projected part of an un-applied surface is held upon application of the holding tape, in the applying of a holding tape.

9. The method for holding the semiconductor wafer according to claim 1, wherein the back side of the semiconductor wafer having the adhesive tape applied thereon and the back side of the ring frame are suck and held, then a release tape is applied, and simultaneously the holding tape is separated integrally with the release tape in a condition that the surface of the semiconductor wafer and the surface of the ring frame are flush with each other, in the separating of the holding tape.

10. The method for holding the semiconductor wafer according to claim 1 further comprising:

irradiating the holding tape by ultraviolet rays before separation of the holding tape.

* * * * *